(12) United States Patent
Goudarzi

(10) Patent No.: US 9,082,766 B2
(45) Date of Patent: Jul. 14, 2015

(54) METHOD TO ENHANCE RELIABILITY OF THROUGH MOLD VIA TMVA PART ON PART POP DEVICES

(71) Applicant: MOTOROLA MOBILITY LLC, Libertyville, IL (US)

(72) Inventor: Vahid Goudarzi, Coral Springs, FL (US)

(73) Assignee: Google Technology Holdings LLC, Mountain View, CA (US)

( * ) Notice: Subject to any disclaimer, the term of this patent is extended or adjusted under 35 U.S.C. 154(b) by 0 days.

(21) Appl. No.: 14/093,544

(22) Filed: Dec. 2, 2013

(65) Prior Publication Data

US 2015/0041979 A1     Feb. 12, 2015

Related U.S. Application Data

(63) Continuation of application No. 61/862,687, filed on Aug. 6, 2013.

(51) Int. Cl.
*H01L 21/56* (2006.01)
*H01L 23/498* (2006.01)
(Continued)

(52) U.S. Cl.
CPC ...... *H01L 23/49811* (2013.01); *H01L 23/3128* (2013.01); *H01L 23/49827* (2013.01); *H01L 24/81* (2013.01); *H01L 25/105* (2013.01); *H01L 25/50* (2013.01); *H01L 24/13* (2013.01); *H01L 24/16* (2013.01); *H01L 24/32* (2013.01); *H01L 24/48* (2013.01); *H01L 24/73* (2013.01); *H01L 2223/54486* (2013.01); *H01L 2224/131* (2013.01); *H01L 2224/16225* (2013.01); *H01L 2224/32145* (2013.01); *H01L 2224/32225* (2013.01); *H01L 2224/48227* (2013.01); *H01L 2224/73265* (2013.01); *H01L 2225/0651* (2013.01); *H01L 2225/06568* (2013.01); *H01L 2225/1023* (2013.01); *H01L 2225/1058* (2013.01); *H01L 2225/1082* (2013.01);
(Continued)

(58) Field of Classification Search
CPC ........................................................ H01L 21/56
USPC ................................... 438/124, 126, 127
See application file for complete search history.

(56) References Cited

U.S. PATENT DOCUMENTS 5,805,427 A      9/1998   Hoffman
5,972,734 A  *  10/1999   Carichner et al. ............ 438/106
(Continued)

OTHER PUBLICATIONS

Zwenger, Curtis et al.: "Surface Mount Assembly and Board Level Reliability for High Density POP (Package-on-Package) Utilizing Through Mold Via Interconnect Technology", Originally published in the Proceedings of the SMTA International Conference, Orlando, Florida, Aug. 17-21, 2008, all pages.
(Continued)

*Primary Examiner* — George Fourson, III
(74) *Attorney, Agent, or Firm* — Leydig, Voit & Mayer, LTD.

(57) ABSTRACT

A Through Mold Via (TMV) Integrated Circuit (IC) package is provided as a bottom IC package for a TMV Package on Package (POP) configuration. The TMV IC package has an overmold top portion having a substantially flat surface and spacer or standoff features extending upward from the flat surface. The spacer or standoff features are configured to abut the bottom surface of the top POP package during softer reflow in order to maintain a gap of predetermined height between the top and bottom IC packages.

5 Claims, 6 Drawing Sheets

(51) Int. Cl.
  *H01L 23/00*  (2006.01)
  *H01L 23/31*  (2006.01)
  *H01L 25/10*  (2006.01)
  *H01L 25/00*  (2006.01)

(52) U.S. Cl.
  CPC . *H01L2225/1094* (2013.01); *H01L 2924/1431* (2013.01); *H01L 2924/1434* (2013.01); *H01L 2924/15311* (2013.01); *H01L 2924/15331* (2013.01); *H01L 2924/1815* (2013.01)

(56) References Cited

U.S. PATENT DOCUMENTS

| | | | | |
|---|---|---|---|---|
| 6,306,680 | B1* | 10/2001 | Fillion et al. | 438/106 |
| 6,956,296 | B2* | 10/2005 | Boyaud et al. | 257/787 |
| 8,030,748 | B2* | 10/2011 | Ye et al. | 257/686 |
| 2009/0130801 | A1* | 5/2009 | Fukuda et al. | 438/123 |
| 2011/0062602 | A1* | 3/2011 | Ahn et al. | 257/787 |
| 2012/0018865 | A1* | 1/2012 | Camacho et al. | 257/676 |
| 2012/0205795 | A1 | 8/2012 | Kim et al. | |
| 2013/0207141 | A1* | 8/2013 | Reiherzer | 257/98 |

OTHER PUBLICATIONS

Zwenger, Curtis et al.: "Next Generation Package-on-Package (PoP) Platform with Through MOld Via (TMV) Interconnection Technology", Originally published in the proceedings of the IMAPS Device Packaging Conference, Scottsdale, AZ, Mar. 10-12, 2009, all pages.
Tessera: "µPILR™ Package-On-Package Solution", Copyright 2007, Tessera, Inc, DS00058—Dec. 2007, all pages.
European Patent Office, International Search Report and the Written Opinion in International Patent Application PCT/US2014/049949 (Oct. 8, 2014).

* cited by examiner

METHOD TO ENHANCE RELIABILITY OF THROUGH MOLD VIA TMVA PART ON PART POP DEVICES

TECHNICAL FIELD

The present invention generally relates to Through Mold Via (TMV) Package-on-Package (POP) assemblies. In particular embodiments provide a method and apparatus to create a gap between the top and bottom package on TMV POP assemblies to thereby provide a standoff between the top and bottom package that impacts the assembly's solder joint reliability.

BACKGROUND

Through Mold Via (TMV) is a technology used with integrated circuit Package-on-Package (POP) Integrated Circuit (IC) connections. A first chip package has solder bumps on the bottom for reflow-soldering, for example, to a printed circuit board. The first chip package also has pads or solder pumps exposed on its top surface for the purpose of enabling a second-chip package to be positioned on the top of the first-chip package and reflow soldered thereon in order to establish electrical connections between solder bumps on the bottom of the second-chip package and the solder bumps or pads on the top of the first-chip package.

During the manufacturing process of a TMV POP assembly, a top IC package, having solder locations on its bottom surface, is soldered to the top of a bottom IC package having solder pads and/or solder balls on its top surface. During the solder reflow process the top package is positioned on top of the bottom package and aligned with the appropriate solder connections. As the solder reflow process progresses, the temperature is increased until the solder flows and the top IC package "collapses" (closes the gap originally created by the solder balls between the two packages) down onto the bottom IC package. In other words, as the solder bumps between the top IC package and the bottom IC package melt, the top IC package lowers onto or becomes much closer to the top of the bottom IC package thereby significantly decreasing any gap distance that existed between the two packages prior to the reflow process.

In general, all Ball Grid Array (BGA) packages that have solder balls on their bottom surface collapse or significantly close the gap between the bottom surface of the BGA package and the top surface to which the BGA package is being soldered during the reflow or substantially similar soldering process.

For example, if the standoff height (i.e., the gap between the bottom of a BGA package and a PC board) is about 12 mils, then when the solder reflow process occurs and the solder balls on the bottom surface of the BGA package melt, the standoff height or gap may decrease to less than about 8 mils between the bottom surface of the BGA package and the top of the PC board. Thus, the BGA package collapses or moves down about 4 mils or more when the solder balls are reflowed to form the electrical connections and solder joints therebetween. In some situations the package collapses to less than 1 mil or collapses in an un-uniform manner such that the top package is slanted or tilted.

BRIEF DESCRIPTION OF THE DRAWINGS

For a more complete understanding, reference is now made to the following description taken in conjunction with the accompanying drawings in which.

DETAILED DESCRIPTION

While the specification concludes with claims to defining features of the invention that are regarded as novel, it is believed that the invention will be better understood from consideration of the description in conjunction with the drawings. As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ embodiments in virtually any appropriated detailed structure. Further, the terms and phrases used herein are not intended to be limiting but rather to provide an understandable description of the invention.

Figure 1:
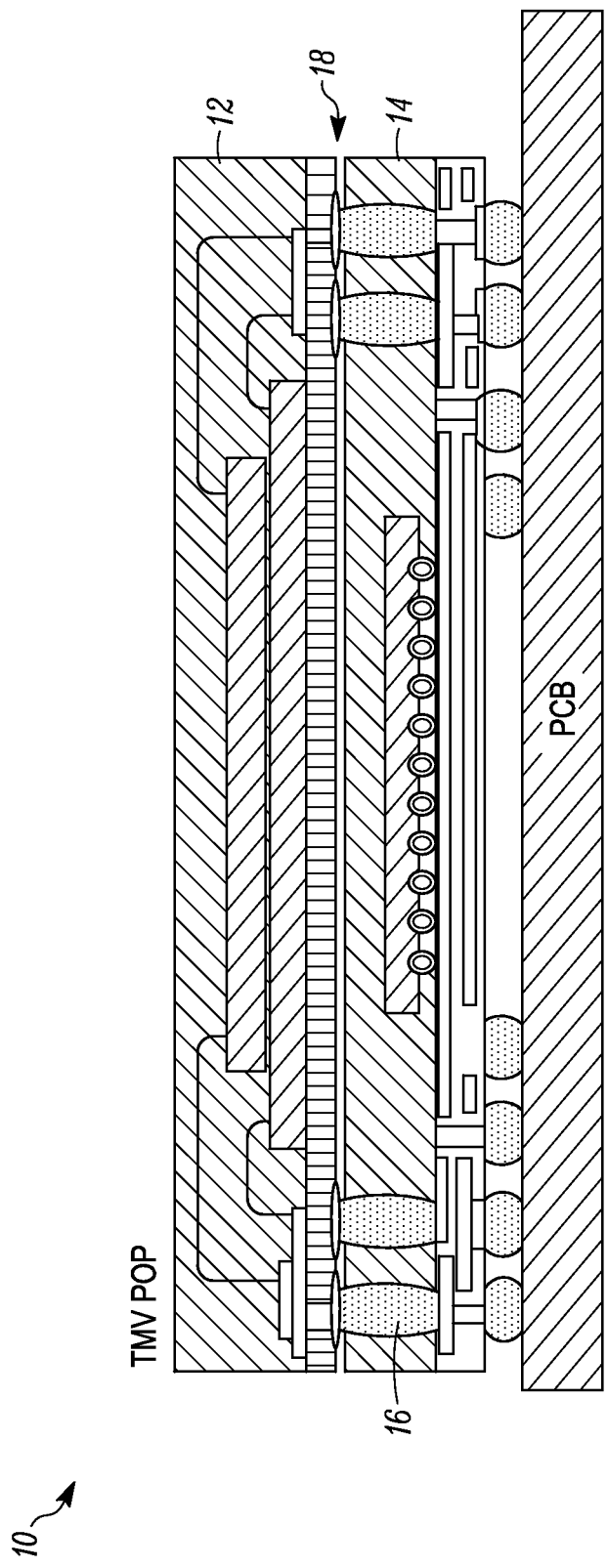
FIG. 1 depicts a prior art TMV POP assembly having an insufficient gap between the top IC package and the bottom IC package.
Figure 2:
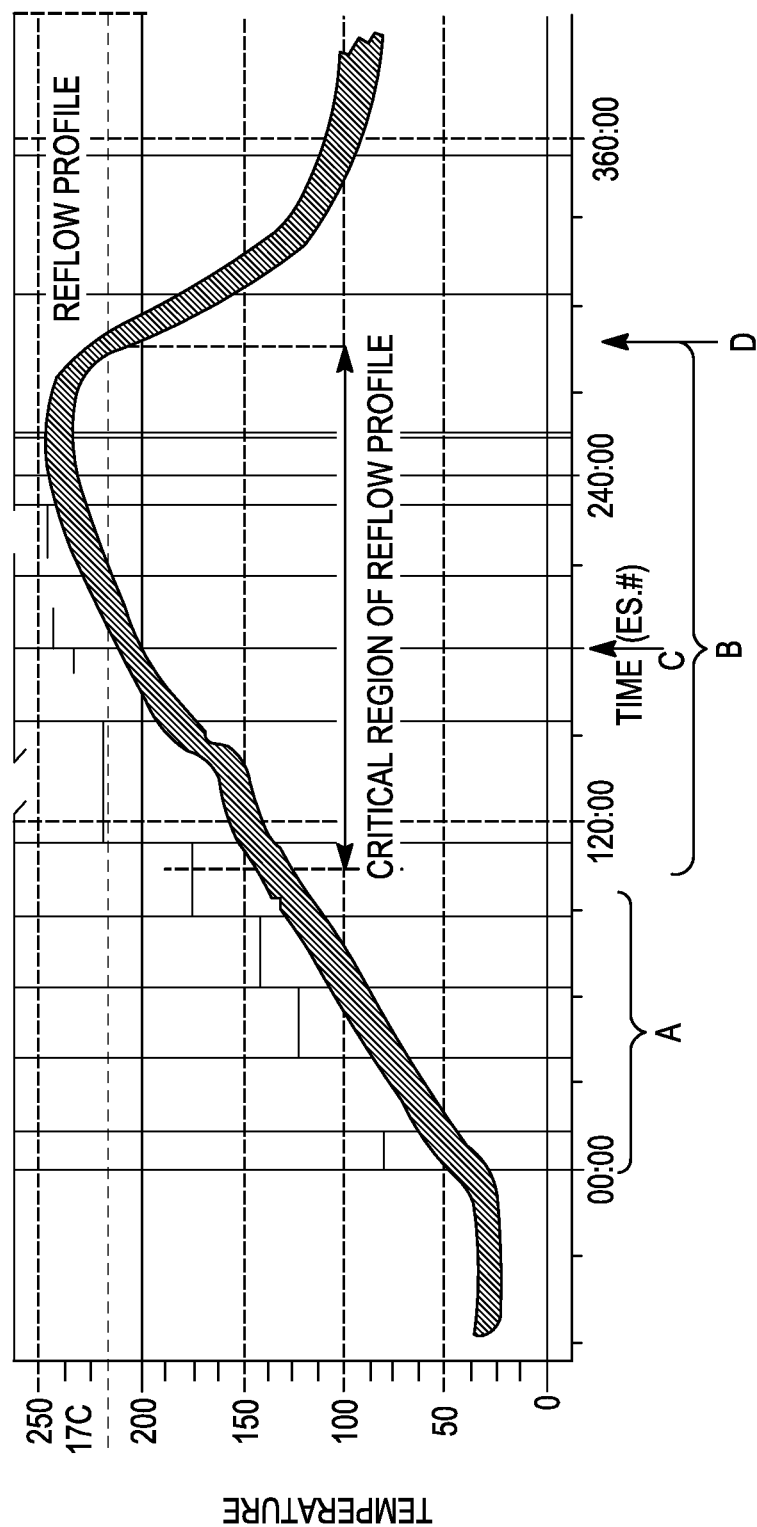
FIG. 2 depicts an exemplary solder reflow profile graph.

Referring to FIGS. 1 and 2, FIG. 1 provides a prior art Through Mold Via (TMV) Package-on-Package (POP) assembly. FIG. 2 provides a graph of a solder reflow profile for a Gall Grid Array (BGA) style package, such as a TMV POP. During time period A in FIG. 2, a PC board having devices to be reflow soldered thereon, such as a TMV POP device, is placed into a reflow oven. During time period A, the temperature of the solder increases toward about 125 degrees C. At about 125 degrees C. the solder temperature enters a critical region of the solder reflow profile which is time period B. At about time C, which is in the critical region of the reflow profile B, the solder reaches its melting point of between about 215 degrees C. to about 222 degrees C. depending on the solder alloy composition used for the solder bumps or balls.

Additionally a solder flux, that was applied to the solder surfaces and which is acidic in nature, melts and removes oxide from the exterior surfaces of the solder bumps or balls. When the solder balls melt, the IC package will collapse onto the surface to which it is being soldered.

FIG. 1 depicts a TMV POP package 10 that comprises a top package 12 and a bottom package 14. The top package 12 has been electrically connected by a solder reflow process to the solder ball joints 16 positioned on the top side of the bottom package 14. In this figure, the top package 12 collapsed onto the bottom package 14 when the solder balls 16 melted during the reflow process. The collapse of the top package 12 onto the bottom package 14 left little or no space in the form of gap 18 between the bottom surface of the top package 12 and the top surface of the bottom package 14.

A TMV POP solder reflow process is a convection reflow process, rather than a conduction reflow process. A convection reflow process relies on hot air, rather than touch (conduction) to transfer heat from the reflow oven atmosphere to the solder balls or solder ball joints between a top package 12 and a bottom package 14. During a TMV POP reflow process heat transfer between air and the solder balls is performed through convection so as to make the solder balls melt.

When the top package 12 collapses onto the bottom package 14 and closes or decreases the size of the gap 18, the convection airflow between the two packages no longer exists. Hot air can no longer move freely between the two packages and among the newly-melted and joined solder balls 16.

Referring for a moment back to FIG. 2, after the solder balls have melted at Time C and the top package 12 collapses onto the bottom package 14, the temperature of the oven and/or solder balls continues to increase above the melting point and then drop below the solder alloy melting point at about Time D.

Due to the lack of airflow in the gap 18 between the top and bottom packages 12 and 14, two common failure modes often occur in prior art TMV POP devices. A first failure mode occurs due to dendrite or metal growth between solder connections caused over time by the excessive flux remaining between the top and bottom packages after collapse. The excess flux could not vaporize after the gap 18 collapsed. The excess flux between the packages causes corrosion about the solder connections or solder ball joints 16 thereby establishing dendrite growth over time causing electrical shorts or resistive shorts between adjacent solder connections. Such electrical shorts or resistive shorts ultimately cause electrical failure of the overall part.

The excessive flux remains between the top and bottom packages due to the lack of heated airflow between the top and bottom packages 12, 14 during the time period from C to D in FIG. 2. If a gap had existed during the time period from C to D, the flux would have been able to boil or vaporize off the part leaving a small amount of residue. The minimal amount of flux residue may be not enough to cause dendrite growth and ultimately failure of the part.

The second failure mode that can occur due to a lack of airflow between the top package 12 and bottom package 14 is called Head-in-Pillow Failure due to insufficient flux. To overcome the first failure mode, sometimes too little flux is used during the reflow process of a prior art TMV POP device 10 so that the flux that is provided is not enough to create dendrite growth after the TMV POP device is soldered together. The resulting Head-in-Pillow Failure is that the limited amount of flux is not enough to clean oxide off the solder ball surfaces during the critical region of the solder reflow profile B. The lack of oxide removal can result in a cold or resistive solder connection often referred to as a Head-in-Pillow Connection between the solder balls that are intended to be reflowed together into solder ball joints 16. A cold or resistive solder connection results in device failure Ideally during the critical region of reflow B, the flux melts and becomes active so as to remove oxide from the solder balls prior to and during the solder alloy melting point around Time C. During the remainder of the critical region of reflow, from Time C to Time D, the flux, as the temperature continues to increase, boils off and vaporizes via the convection process occurring between the top and bottom packages. Thus, what is needed is a TMV package that can be used in a POP configuration that allows for convection airflow between an upper and lower package after collapse occurs in the reflow process.

An embodiment discussed herein provides a TMV POP configuration package that has a gap (a non-collapsible gap) between the top package and the bottom package so that during the convection solder reflow process heated air can circulate between the top and bottom IC packages so that the flux can boil off and vaporize from between the two packages during the later part of the critical region of the reflow profile (i.e. after the solder balls have reflowed). The gap is established by incorporating spacer bumps onto the top surface of the TMV package that abut the bottom surface of the top package so as to maintain a predetermined gap or standoff distance between the two packages.

Figure 3:
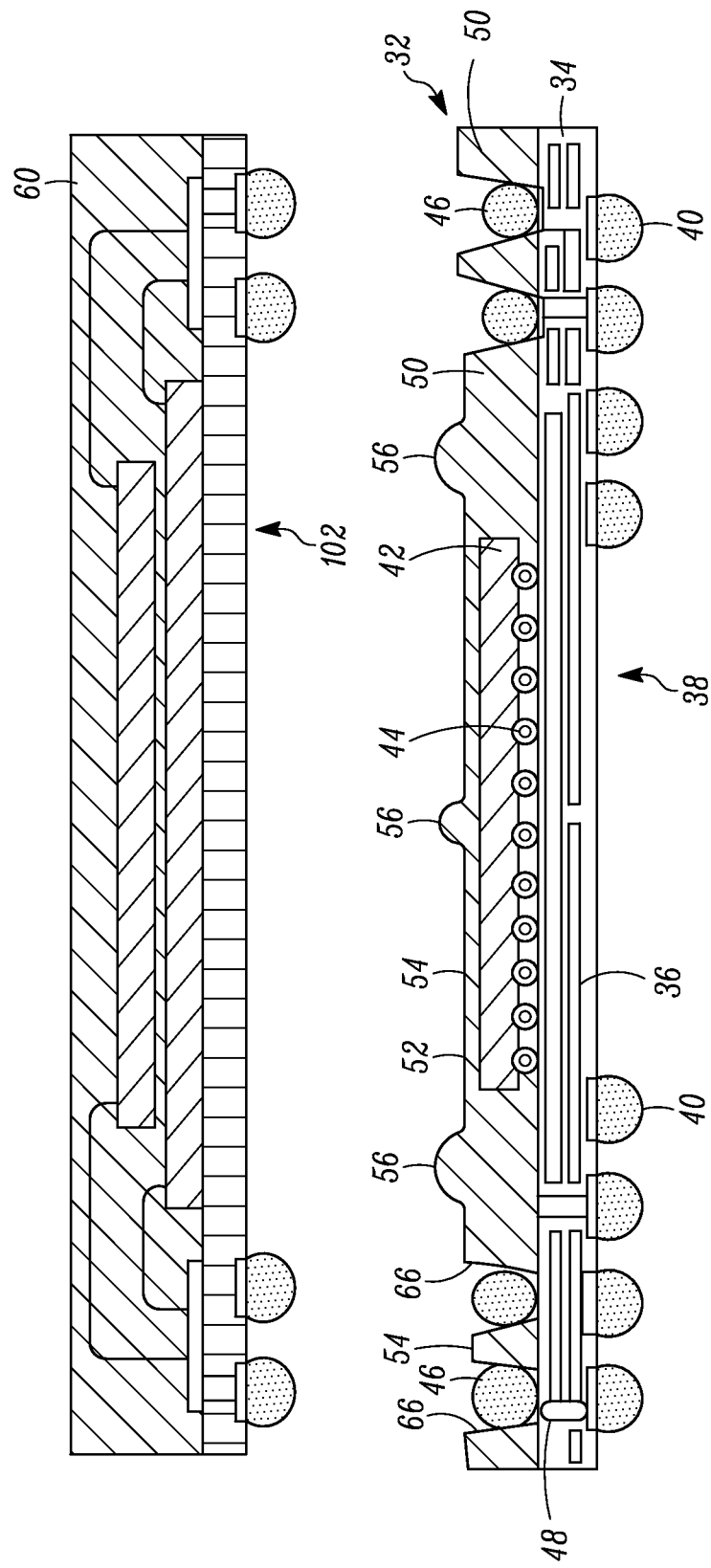
FIG. 3 is a TMV POP before reflow in accordance with an exemplary embodiment.

Referring to FIG. 3, an unconnected top IC package 60 and bottom IC package 32 are depicted. The bottom IC package 32 is a TMV-style package having a chip carrier portion 34. Within the chip carrier portion 34 there may be electrical connections or layers of electrical connections 36 organized to extend or connect between various points on the chip carrier package. On the chip carrier bottom side 38 a plurality of solder balls (bottom solder balls) 40 are attached and adapted for electrically connecting the TMV-styled package to a circuit board (not specifically shown) via a solder reflow process.

An Integrated Circuit (IC) 42 having solder bumps 44 on its bottom side is mounted and electrically connected to the top side of the chip carrier 34. Top solder balls 46 are positioned on top pads 48 that are located on the top side of the chip carrier 34 and at various locations on the IC 42. And overmold material 50 substantially covers the top side of the chip carrier 34 and the IC 42. The top solder balls 46 are not covered by the over-mold material 50. The over-mold material 50 is configured to include or to define an upper surface 52. The upper surface of 52 defines the top surface of the bottom IC package 32. The upper surface 52 comprises a primary portion 54, which is substantially flat and defines a majority of the upper surface 52. The upper surface 52 also comprises a spacer portion(s) 56, which comprises one or more spacer extension 58 that extend a predetermined distance above the primary portion 54.

The spacer portions of 56 are configured to maintain a predetermined gap size 62 (see FIG. 4) between the top IC package 60 and the bottom IC package 32 after the top IC package 60 collapses during the solder reflow process onto the bottom IC package 32.

Figure 4:
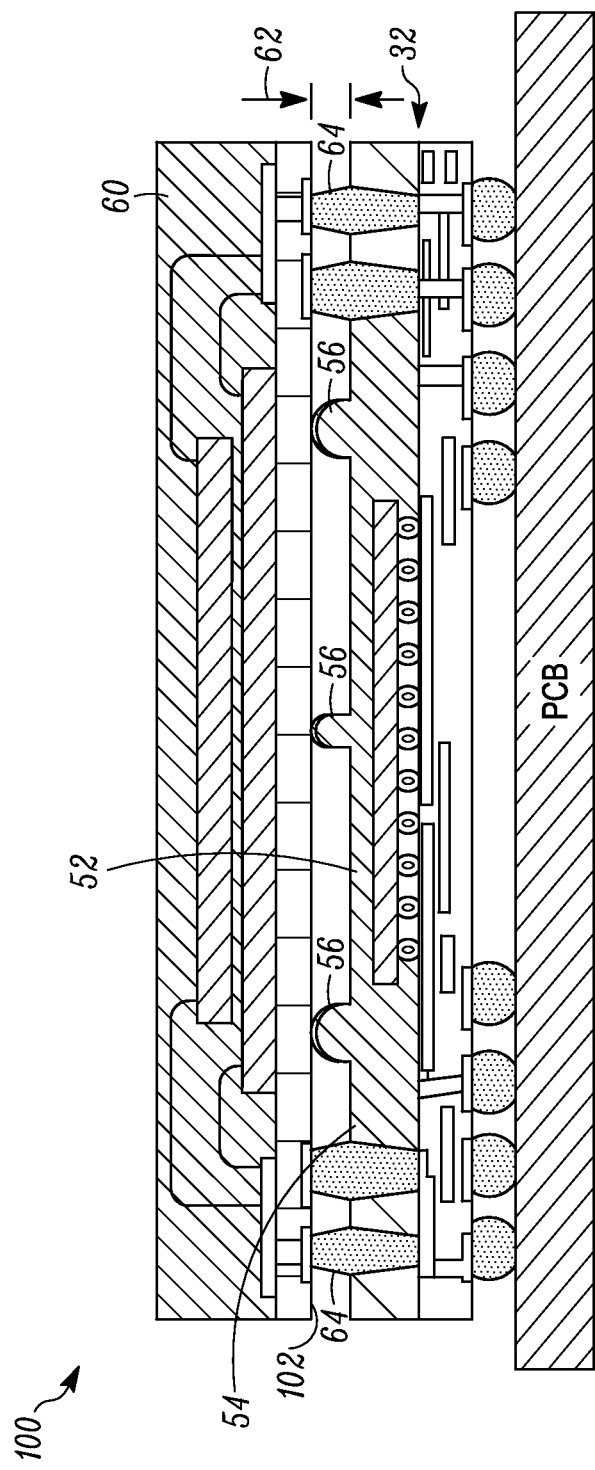
FIG. 4 is a TMV POP after reflow in accordance with an exemplary embodiment.

Referring now to FIG. 4, and exemplary TMV POP 100 is depicted after a solder reflow process and in accordance with various embodiments. The spacer portions of 56 extend a pre-determined distance from the upper surface 52 of the primary over-molded portion which substantially covers the top side of the chip carrier and the semiconductor chip. The spacer portion(s) 56 abut the bottom side 102 of the top IC package 60 to thereby establish a gap 62 between the top IC package 60 and the bottom IC package 32. The gap 62 allows for convection airflow to move and disperse between the top and bottom IC packages 60, 32 during the solder reflow process such that flux can boil off and vaporize substantially completely by the end D of the critical region B of the reflow profile shown in FIG. 2.

As such, embodiments provide a method to create a non-collapsible gap 62 between the top IC package and bottom IC package 60, 32 on a TMV POP which addresses the two common failure modes of dendrite growth or Head-in-Pillow Creation discussed herein above. Additionally, the gap size 62 can be adjusted by the height of the spacer or standoff portion(s) 56 to thereby create a column solder connection 64 out of the solder balls from the bottom of the second (top) IC package 60 and the top of the first (bottom) IC package 32. Establishing a predetermined standoff height or gap size 62 improves the reliability of the overall TMV POP package 100.

In various embodiments each spacer feature, portion or standoff 56 extends from about 2 mils to about 5 mils above the flat top upper surface 52 of the primary portion 54. In other embodiments the spacer portion or feature 56 comprises a bump shape that can be hemispherical or substantially any derivation thereof. That is the bump shape could be elongated in the form of a line, zigzag, curvilinear line, geometric shape or substantially any other elongated bump shape. Each bump must be small, discrete or positioned to allow airflow through and about the gap or standoff area 62.

Additionally in some embodiments, there may be anywhere from one to about nine spacer features spaced apart from each other and each extending a same standoff measurement upward from the upper surface 52 of the primary portion of 54. The standoff measurement of each spacer feature may be between about 2 mils to about 7 mils.

Referring back to FIG. 3, an exemplary TMV 60 device has vias 66 that extend through the over-mold 50 and about each of the top solder balls 46. The chip carrier portion 34, in some embodiments, may be an OMAP chip carrier, other standardized chip carrier or a derivation thereof available in the industry.

Figure 5:
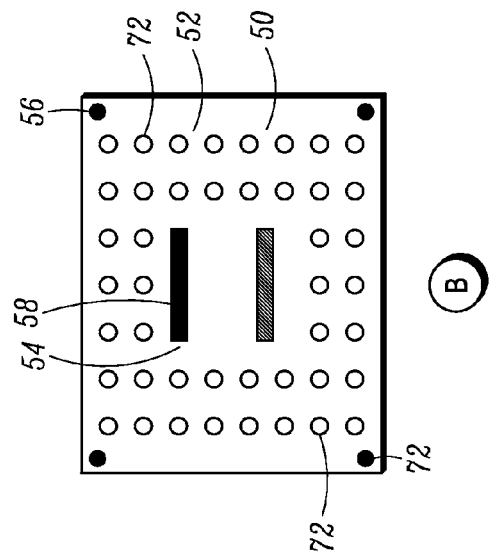
FIGS. 5A, B, and C depict a plurality of exemplary TMV package configurations.
Figure 5:
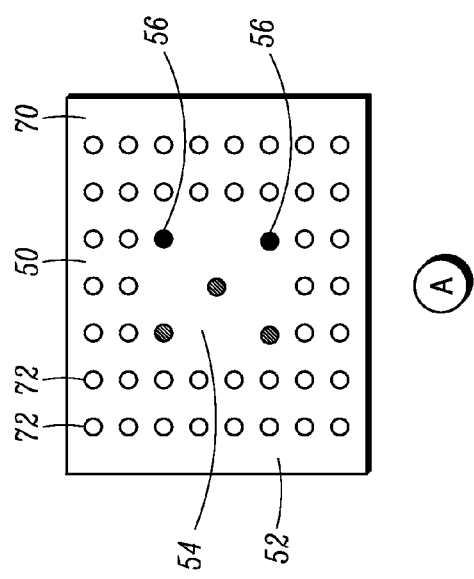
Figure 5:
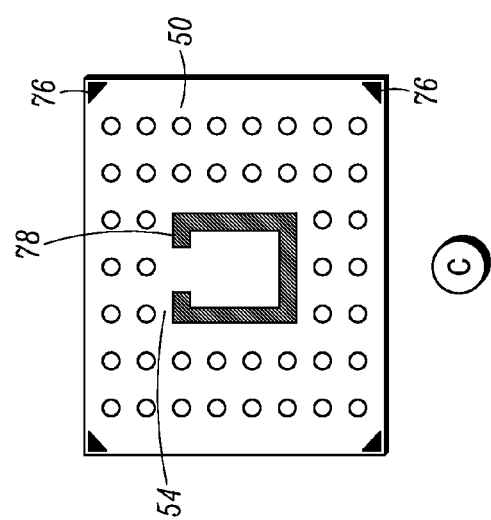

Referring now to FIG. 5A a top view of an exemplary TMV 70 is shown. There are a plurality of vias 72 extending through the over-mold 50 of the TMV 70. In each of the vias 72 is a solder ball (not specifically shown for clarity). The upper surface 52 of the over-mold portion 50 is substantially flat and has spacer portions 56 extending from the primary portion 54 and/or upper surface 52 of the over-mold 50. Here the spacer portions or features 56 are bumps extending upward from the upper surface 52.

In FIG. 5B the spacer features or portions are of two different configurations. The first type of spacer feature is a bump or standoff 56 extending upward from the upper surface 52 of the over-molded portion 50 while the second type of spacer feature 58 is an elongated bump that is substantially linear and positioned on the primary portion 54 of the over-mold 50. It is important to note that the spacer features can be located within the central area or primary portion 54 of the over-mold 50 or adjacent or approximate to the vias 72.

In FIG. 5C the spacer portions or features 76 have a triangular bump shape and it is understood that these bumps could be substantially any geometric or non-geometric shape. Additionally centrally located spacer feature 78 comprises a plurality of elongated bump shapes that form an open rectangular shape within the confines of the primary portion 54 of the over-mold 50. It is understood that the open rectangle could be an open triangle, circle, or other geometric or non-geometric shape. In various embodiments, the elongate bumps can be a closed shape, a set of lines, curves or angled elongated features. Additionally, the spacer features can be any combination or permutation of bumps, standoffs, geometric or non-geometric shapes or elongated shapes. Further, in some embodiments, the standoffs or spacer portions can include embossed insignia in the form of, for example, letters, logos, designs or identification insignia.

Regardless of the spacer feature or portion configuration, the spacer feature(s) each have a maximum height that in combination substantially establish a plane on which an upper or top IC package can abut against during collapse in the solder reflow process thereby establishing a non-collapsible gap 62 that is of the same measurement between the bottom surface of the top IC package 60 and the upper surface 52 of the bottom IC package or TMV package 32. In other words, when the top IC package abuts the tops of the spacer features, a substantially uniform gap is established between the top and bottom ICs. Additionally, the top and bottom ICs will be substantially parallel to each other after collapse.

Figure 6:
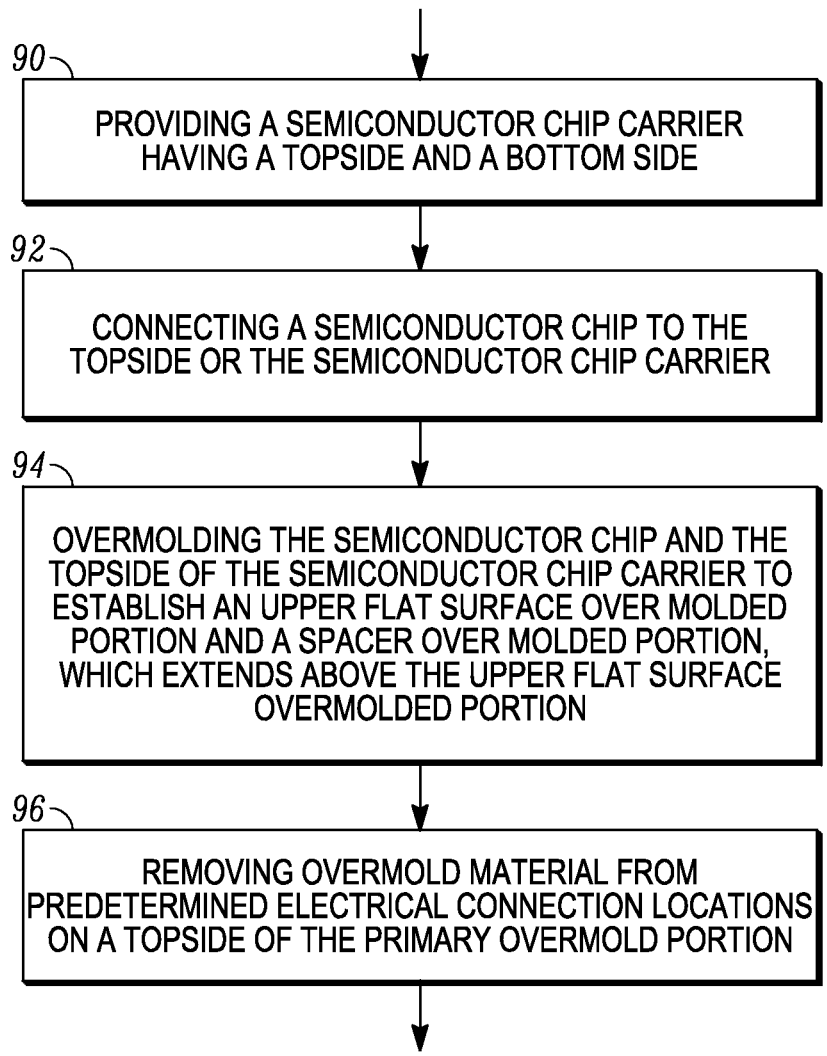
FIG. 6 is a flow chart providing a method of manufacturing and exemplary TMV package.

Referring now to FIG. 6 and FIG. 3, a flow chart of a method of manufacturing an exemplary TMV package 32 is shown. At Step 90 a semiconductor chip 34 carrier having a top side and a bottom side is provided. An exemplary semiconductor chip carrier may be one of a variety of standard or non-standard semiconductor chip carriers including, for example an OMAP chip carrier or other permutations or derivations thereof. At Step 92 the semiconductor chip 42 is soldered or connected to the top side of the semiconductor chip carrier. In some embodiments the semiconductor chip 42 may include a variety of circuits such as, but not limited to, microprocessors, microcontrollers, memory, arithmetic logic units and any combinations or derivations thereof. Additionally in Step 92 solder balls 46 may be placed or connected to pads 48 or wires located on a top side of the chip carrier 34 and about the semiconductor chip attached thereto.

In Step 94 an over-molding process is performed wherein the semiconductor chip, the top-side solder balls and the top side of the semiconductor chip carrier are over-molded to establish an upper flat surface portion 54. In the same or a separate over-molding process, spacer features 56 or a spacer over-mold portion is created such that the spacer features extend above the upper flat surface 54 of the primary over-molded portion. In various embodiments, the spacer features are embossed a predetermined distance above the upper flat surface portion 54 and configured to establish a gap 62 between the upper surface of the exemplary TMV package and the bottom surface or bottom side 102 of a top IC package 60 when being soldered or attached as a POP TMV configuration in a manner similar to the example shown in FIG. 4. The gap 64 that would be created by the spacer features will allow for convection airflow to move and disperse between the top and bottom packages of the POP TMV part to aid in the vaporization of flux and decrease the likelihood of dendrite formation during the useful life of the POP TMV device.

At Step 96 over-mold material is removed from predetermined electrical connection locations on the top side of the primary over-mold portion thereby establishing vias about the solder balls 46 that were previously encased in the over-molding of Step 94. The solder balls 46 are thereby made available for soldering to solder ball connections on the bottom side 102 of a top IC package 60.

In various embodiments the primary over-mold portion has the upper-flat surface and the spacer over-mold portion. The spacer over-mold portion(s) extend or are embossed a predetermined distance above the upper flat surface and can be created in a single over-molding process. In some embodiments the spacer features could be added in the secondary step or steps.

Although a few embodiments in the invention and method have been shown and described, it will be appreciated by those skilled in the art that changes may be made to these embodiments without departing from the principles and the spirit of the invention.

What is claimed is:

1. A method of manufacturing a Through Mold Via (TMV) package, the method comprising:

providing a chip carrier having a top side and a bottom side;

electrically connecting an integrated circuit (IC) onto the top side of the chip carrier;

attaching solder balls to the top side of the chip carrier and about the IC;

over molding the top side of the chip carrier, the integrated circuit and the solder balls with an over molded portion, the over molded portion comprising:

a primary over molded portion substantially covering the top side of the chip carrier, the IC and the solder balls, the primary over molded portion further comprising a substantially flat top surface; and a spacer over molded portion comprising at least one spacer feature extending a predetermined height above the flat top surface; and ablating over molded material to expose the solder balls.

2. The method of manufacturing of claim 1, wherein the primary over molded portion and the spacer over molded portion are created in a single over molding step.

3. The method of manufacturing of claim 1, wherein the predetermined height is between about 2 mills and about 5 mils.

4. The method of manufacturing of claim 1, wherein each spacer feature comprises a shaped bump.

5. The method of manufacturing of claim 1, wherein the spacer feature comprises an elongate shaped bump.

* * * * *